(12) United States Patent
Im et al.

(10) Patent No.: US 8,564,023 B2
(45) Date of Patent: Oct. 22, 2013

(54) INTEGRATED CIRCUIT WITH MOSFET FUSE ELEMENT

(75) Inventors: Hsung Jai Im, Cupertino, CA (US); Sunhom Paak, San Jose, CA (US); Boon Yong Ang, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 529 days.

(21) Appl. No.: 12/043,914

(22) Filed: Mar. 6, 2008

(65) Prior Publication Data
US 2009/0224323 A1    Sep. 10, 2009

(51) Int. Cl.
*H01L 23/52* (2006.01)
(52) U.S. Cl.
USPC .................... 257/209; 257/529; 257/E21.526
(58) Field of Classification Search
USPC .................. 257/209, 529, E21.521, E21.524, 257/E21.526; 438/238
See application file for complete search history.

(56) References Cited

U.S. PATENT DOCUMENTS

| | | | |
|---|---|---|---|
| 4,219,836 A | 8/1980 | McElroy |
| 4,238,839 A | 12/1980 | Redfern et al. |
| 4,562,454 A | 12/1985 | Schultz et al. |
| 4,647,340 A | 3/1987 | Szluk et al. |
| 4,872,140 A | 10/1989 | Graham et al. |
| 5,166,758 A | 11/1992 | Ovshinsky et al. |
| 5,708,291 A | 1/1998 | Bohr et al. |
| 5,742,555 A | 4/1998 | Marr et al. |
| 5,874,851 A | 2/1999 | Shiota |
| 6,060,743 A | 5/2000 | Sugiyama et al. |
| 6,258,700 B1 | 7/2001 | Bohr et al. |
| 6,368,902 B1 | 4/2002 | Kothandaraman et al. |
| 6,496,416 B1 | 12/2002 | Look |
| 6,522,582 B1 | 2/2003 | Rao et al. |
| 6,525,397 B1 | 2/2003 | Kalnitsky et al. |
| 6,597,013 B2 | 7/2003 | Romas, Jr. et al. |
| 6,621,095 B2 | 9/2003 | Chiang et al. |
| 6,671,205 B2 | 12/2003 | Look |

(Continued)

FOREIGN PATENT DOCUMENTS

| | | |
|---|---|---|
| EP | 0 161 947 A | 11/1985 |
| JP | 2004-047987 | 2/2004 |

(Continued)

OTHER PUBLICATIONS

U.S. Appl. No. 11/449,171, filed Jun. 8, 2006, Ang, Boon Yong et al. entitled "Integrated Circuit with Fuse Programming Damage Detection", Xilinx, Inc. 2100 Logic Drive, San Jose, California 95124.

(Continued)

*Primary Examiner* — Matthew Landau
*Assistant Examiner* — Candice Y Chan
(74) *Attorney, Agent, or Firm* — Scott Hewett; LeRoy D. Maunu

(57) ABSTRACT

At least one MOS parameter of a MOS fuse is characterized to provide at least one MOS parameter reference value. Then, the MOS fuse is programmed by applying a programming signal to the fuse terminals so that programming current flows through the fuse link. The fuse resistance is measured to provide a measured fuse resistance associated with a first logic value. A MOS parameter of the programmed MOS fuse is measured to provide a measured MOS parameter value. The measured MOS parameter value is compared to the reference MOS parameter value to determine a second logic value of the MOS fuse, and a bit value is output based on the comparison.

14 Claims, 5 Drawing Sheets

(56) References Cited

U.S. PATENT DOCUMENTS

| | | | |
|---|---|---|---|
| 6,703,680 | B2 | 3/2004 | Toyoshima |
| 6,804,159 | B2 | 10/2004 | Kamiya et al. |
| 6,807,079 | B2 | 10/2004 | Mei et al. |
| 6,882,571 | B1 | 4/2005 | Look |
| 6,911,360 | B2 * | 6/2005 | Li et al. .................... 438/238 |
| 6,913,954 | B2 * | 7/2005 | Kothandaraman ............ 438/132 |
| 6,930,920 | B1 | 8/2005 | Look |
| 6,936,527 | B1 | 8/2005 | Look |
| 7,026,692 | B1 * | 4/2006 | Look .......................... 257/390 |
| 7,068,072 | B2 | 6/2006 | New et al. |
| 7,092,273 | B2 | 8/2006 | Look |
| 7,098,721 | B2 | 8/2006 | Ouellette et al. |
| 7,180,102 | B2 | 2/2007 | Hui |
| 7,224,633 | B1 | 5/2007 | Hovis et al. |
| 2004/0004268 | A1 | 1/2004 | Brown et al. |
| 2004/0124458 | A1 | 7/2004 | Kothandaraman |
| 2005/0247997 | A1 | 11/2005 | Chung et al. |
| 2005/0280083 | A1 | 12/2005 | Vogelsang |
| 2006/0237818 | A1 | 10/2006 | Chang |
| 2007/0063313 | A1 | 3/2007 | Barth et al. |
| 2009/0003028 | A1 | 1/2009 | Keshavarzi et al. |

FOREIGN PATENT DOCUMENTS

| | | |
|---|---|---|
| JP | 2007-042780 | 2/2007 |
| JP | 2007 042780 A | 2/2007 |
| JP | 2007-194377 | 2/2007 |
| JP | 2007 194377 A | 8/2007 |

OTHER PUBLICATIONS

U.S. Appl. No. 11/588,775, filed Oct. 27, 2006, Paak, Sunhom et al., entitled "One-Time-Programmable Logic Bit with Multiple Logic Elements", Xilinx, Inc. 2100 Logic Drive, San Jose, California 95124.

U.S. Appl. No. 12/043,103, filed Mar. 5, 2008, Im, Hsung Jai et al., entitled "Method of Improving Post-Program Resistance Distribution of eFuse Cell and realizing eFuse MLC by Multi-Step".

Alexander Kalnitzky et al., CoSi2 integrated fuses on poly silicon for low voltage 0.18um CMOS applications, Sep. 1999, pp. 765-768 IEEE, 3 Park Avenue, 17th Floor, New York, NY 10016-5997.

Jerome B. Lasky et al., "Comparison of Transformation to Low-Resistivity Phase and Agglomeration of TiSi2 and CoSi2," IEEE Transactions on Electron Devices, vol. 38, No. 2, Feb. 1991, pp. 262-269, IEEE, 3 Park Avenue, 17th Floor, New York, NY 10016-5997.

Mohsen Alavi et al., A PROM Element Based on Salicide Agglomeration of Poly Fuses in a CMOS Logic Process, Jul. 1997, pp. 855-858, IEEE, 3 Park Avenue, 17th Floor, New York, NY 10016-5997.

N. Kimizuka et al., "NBTI enchancement by nitrogen incorporation into ultrathin gat oxide for 0.10-um gate CMOS generation," 2000 Symposium on VLSI Technology Digest of Technical Papers, Apr. 2000, pp. 92-93, IEEE, 3 Park Avenue, 17th Floor, New York, NY 10016-5997.

Se-Aug Jang et al., "Effects of Thermal Processes After Silicidation on the Performance of TiSi2/Polysilicon Gate Device," IEEE Transactions on Electron Devices, vol. 46, No. 12, Dec. 1999, pp. 2353-2356, IEEE, 3 Park Avenue, 17th Floor, New York, NY 10016-5997.

Toyoji Yamamoto et al., "Bias Temperature Instability in Scaled p+ Polysilicon Gate p-MOSFET's," IEEE Transactions on Electron Devices, vol. 46, No. 5, May 1999, IEEE, 3 Park Avenue, 17th Floor, New York, NY 10016-5997.

Toyoji Yamamoto et al., "Bias Temperature Instability in Scaled p+ Polysilicon Gate p-MOSFETs," IEEE Transactions on Electron Devices, vol. 46, No. 5, May 1999, IEEE, 3 Park Avenue, 17th Floor, New York, NY 10016-5997.

Rahman, Arifur et al., "Die Stacking Technology for Terabit Chip-to-Chip Communications", Proceedings of 2006 IEEE Custom Integrated Circuits Conference (CICC), Sep. 10-13, 2006, available from IEEE, 3 Park Avenue, 17th Floor, New York, NY 10016-5997.

U.S. Appl. No. 12/043,091, filed Mar. 5, 2008, IM, Hsung Jai, et al., Xilinx, Inc. 2100 Logic Drive, San Jose, CA 95124.

U.S. Appl. No. 12/043,099, filed Mar. 5, 2008, IM, Hsung Jai et al., Xilinx, Inc. 2100 Logic Drive, San Jose, CA 95124.

U.S. Appl. No. 12/043,103, filed Mar. 5, 2008, Im, Hsung Jai, et al., Xilinx, Inc. 2100 Logic Drive, San Jose, CA 95124.

U.S. Appl. No. 12/043,914, filed Mar. 6, 2008, Im, Hsung Jai, et al., Xilinx, Inc. 2100 Logic Drive, San Jose, CA 95124.

U.S. Appl. No. 11/973,062, filed Oct. 4, 2007, Rahman, Arifur et al., Xilinx, Inc. 2100 Logic Drive, San Jose, CA 95124.

U.S. Appl. No. 11/799,886, filed May 2, 2007, Sidhu, Lakhbeer S. et al., Xilinx, Inc. 2100 Logic Drive, San Jose, CA 95124.

U.S. Appl. No. 11/717,836, filed Mar. 13, 2007, Oh, Kwansuhk, et al., Xilinx, Inc. 2100 Logic Drive, San Jose, CA 95124.

U.S. Appl. No. 11/588,775, filed Oct. 27, 2006, Paak, Sunhom et al., Xilinx, Inc. 2100 Logic Drive, San Jose, CA 95124.

U.S. Appl. No. 11/449,171, filed Jun. 8, 2006, Ang, Boon Yong et al., Xilinx, Inc. 2100 Logic Drive, San Jose, CA 95124.

U.S. Appl. No. 12/043,910, filed Mar. 6, 2008, Im, Hsung Jai et al., Xilinx, Inc. 2100 Logic Drive, San Jose, CA 95124.

\* cited by examiner

INTEGRATED CIRCUIT WITH MOSFET FUSE ELEMENT

FIELD OF THE INVENTION

This invention relates generally to integrated circuits, and more particularly to programming a one-time-programmable logic memory cell having a metal-oxide-semiconductor ("MOS") fuse.

BACKGROUND OF THE INVENTION

Many integrated circuits ("ICs") are made up of millions of interconnected devices, such as transistors, resistors, capacitors, and diodes, on a single chip of semiconductor substrate. It is generally desirable that ICs operate as fast as possible, and consume as little power as possible. Semiconductor ICs often include one or more types of memory, such as CMOS memory, antifuse memory, and efuse memory.

One-time-programmable ("OTP") memory elements are used in ICs to provide non-volatile memory ("NVM"). Data in NVM are not lost when the IC is turned off. NVM allows an IC manufacturer to store lot number and security data on the IC, for example, and is useful in many other applications. One type of NVM is commonly called an E-fuse.

E-fuses are usually integrated into semiconductor ICs by using a stripe (commonly also called a "link") of conducting material (metal, poly-silicon, etc.) between two pads, generally referred to as anode and cathode. Applying a fuse current ($I_{FUSE}$) to the E-fuse destroys the link, thus changing the resistance of the E-fuse. This is commonly referred to as "programming" the E-fuse. The fuse state (i.e., whether it has been programmed) can be read using a sense circuit, which is common in the art of electronic memories.

FIG. 1 is a plan view of an E-fuse 100. The E-fuse 100 has a fuse link 102 between an anode 104 and a cathode 106. The anode, fuse link, and cathode are typically polysilicon or silicided polysilicon formed entirely on relatively thick field oxide or isolation oxide. Contacts (not shown) provide electrical terminals to the anode and cathode. The fuse link has a relatively small cross section, which results in Joule heating of the link during programming to convert the E-fuse to a high resistance state. The terms "anode" and "cathode" are used for purposes of convenient discussion. Whether a terminal of an E-fuse operates as an anode or a cathode depends upon how the programming current is applied. Programming of the E-fuse can be facilitated by the physical layout. For example, the cathode 106 is larger than the fuse link 102, which generates localized Joule heating in the fuse link during programming.

During programming, a controlled level of current flows through the fuse link for a specified period. The programming current heats up the fuse link more than the adjacent areas due to current crowding and differences in heat dissipation, creating a temperature gradient. The temperature gradient and the carrier flux causes electro- and stress-migration to take place and drive material (e.g., silicide, dopant, and polysilicon) away from the fuse link.

Programming generally converts the E-fuse from an original resistance to a programmed resistance. It is desirable for the programmed resistance to be much higher (typically many orders of magnitude higher) than the original resistance to allow reliable reading of the E-fuse using a sensing circuit. A first logic state (e.g., a logical "0") is typically assigned to an unprogrammed, low-resistance (typically about 200 Ohms) fuse state, and a second logic state (e.g., a logical "1") to the programmed, high-resistance (typically greater than 100,000 Ohms) fuse state. The change in resistance is sensed (read) by a sensing circuit to produce a data bit.

E-fuse elements are particularly useful due to their simplicity, low manufacturing cost, and easy integration into CMOS ICs using conventional CMOS fabrication techniques. However, undesirable problems such as uncontrolled programming (i.e., overprogramming or underprogramming) or physical damage to adjacent structures can occur, resulting in leakage currents in nearby FETs. Other problems arise when ICs are scaled to smaller design geometries (node spacings) because the programming conditions for one design geometry might not be optimal for another design geometry, undesirably reducing programming yield or increasing programming time. It is desirable to provide E-fuse techniques that overcome the problems of the prior art.

SUMMARY OF THE INVENTION

At least one MOS parameter of a MOS fuse is characterized to provide at least one reference MOS parameter value. Then, the MOS fuse is programmed by applying a programming signal to the fuse terminals so that programming current flows through the fuse link. The fuse resistance is measured to provide a measured fuse resistance associated with a first logic value. A MOS parameter of the programmed MOS fuse is measured to provide a measured MOS parameter value. The measured MOS parameter value is compared to the reference MOS parameter value to determine a second logic value of the MOS fuse, and a bit value is output based on the comparison.

DETAILED DESCRIPTION OF THE DRAWINGS

Figure 1A:
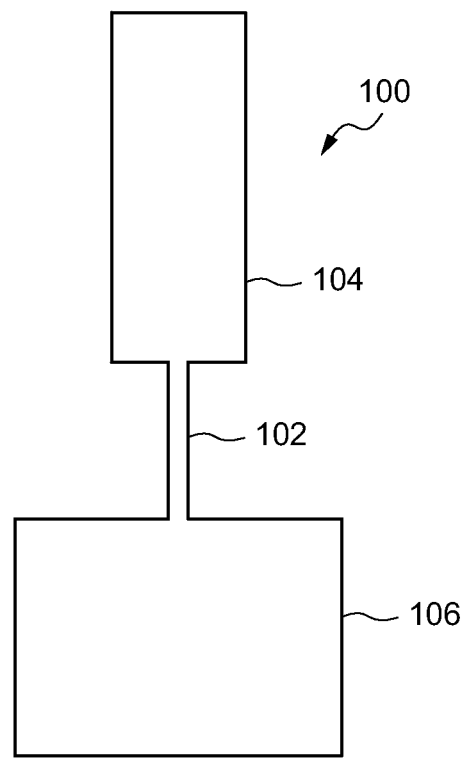
FIG. 1 is a plan view of a prior art E-fuse.
Figure 2A:
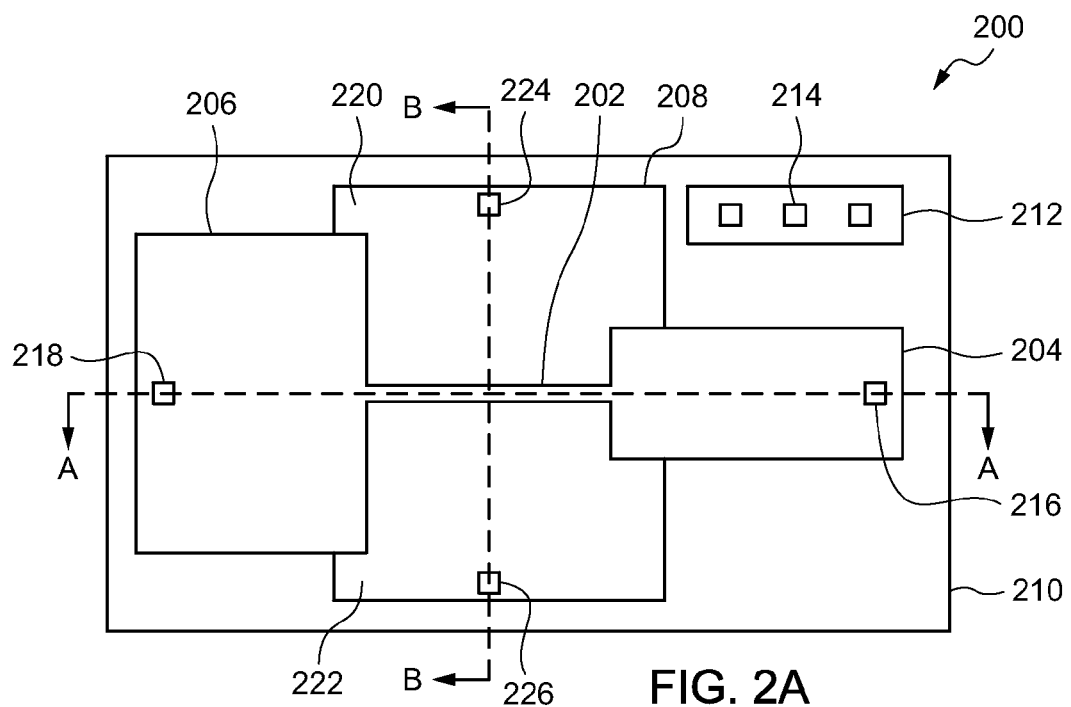
FIG. 2A is a plan view of a MOS fuse according to an embodiment

FIG. 2A is a plan view of a MOS fuse 200 according to an embodiment. The MOS fuse 200 includes a fuse link 202 extending between an anode 204 and a cathode 206. The fuse link 202 extends across an active region 208 of semiconductor material (e.g., silicon), unlike conventional E-fuses that are defined on thick oxide.

In a particular embodiment, the anode, cathode, and fuse link are silicided polysilicon, and the fuse link is separated from the active region of the semiconductor material by a thin oxide layer, which in a particular embodiment is a gate oxide layer, which is a thin oxide layer formed over active silicon (e.g., a channel region of a MOSFET). In a particular embodiment, the thin oxide layer is less than 50 nm thick, and in a further embodiment is a gate oxide layer not more than 10 nm thick. In some embodiments, portions of the anode and cathode also overlie the active region, and are separated from the active region of semiconductor material by the thin oxide layer. Polysilicon deposition, photolithography, and silicidation are commonly used in conventional CMOS fabrication techniques to define gate structures of FETs, and embodiments of the invention are easily incorporated into CMOS ICs using standard processing. For purposes of convenient discussion, the anode-link-cathode structure will be referred to as a "fuse element", which will be used to describe this feature both before programming and after programming, when the fuse link is likely substantially gone, and the term "fuse resistance" will be used for purposes of discussion to indicate the resistance of (through) the fuse element.

The active region 208 is formed in a well 210 formed in a semiconductor substrate, such as a silicon wafer. A well tap 212 provides an electrical connection to the well 210 through contacts 214, which allow the well to be biased at a selected potential or allow detection of well potential or current. Contacts 216, 218 similarly provide electrical connections to the anode 204 and cathode 206 for programming the fuse link and sensing the logic state of the fuse link.

Source/drain ("S/D") regions 220, 222 are also formed in the active region 208. S/D diffusions (see FIG. 2C, ref. nums. 221, 223) are formed in the S/D regions. S/D regions and diffusions are well known in the art of MOS FETs; however, the fuse link 202 of the MOS fuse 200 operates very differently than the gate of a MOS FET. While the MOS-fuse can be biased and operated in the same manner as a MOSFET, in which case anode or cathode terminals can act as gate (which may be tied together or only one of them may be biased), the fuse link is intended to be programmed. The anode and cathode terminal allow substantial direct current to flow through the fuse link 202 during programming. In a conventional MOSFET, direct current through the gate is generally undesirable, and conventional gates are biased to a single, common potential, and often have only a single gate terminal. Contacts 224, 226 provide electrical connections to the S/D regions 220, 222.

In a particular embodiment, the anode 204, cathode 206, and fuse link 202 are defined from a polysilicon layer deposited on the silicon wafer using photolithographic techniques. Gate electrodes of FETs and other polysilicon features are typically also defined from the polysilicon layer when the MOS fuse 200 is incorporated in a CMOS IC. Optionally, a layer of silicide-forming material, of which several are known, is deposited on the substrate and processed to form silicide on exposed silicon. Silicide forms on the exposed polysilicon of the anode, link, and cathode, and on the exposed silicon of the S/D regions 220, 222.

Figure 2B:
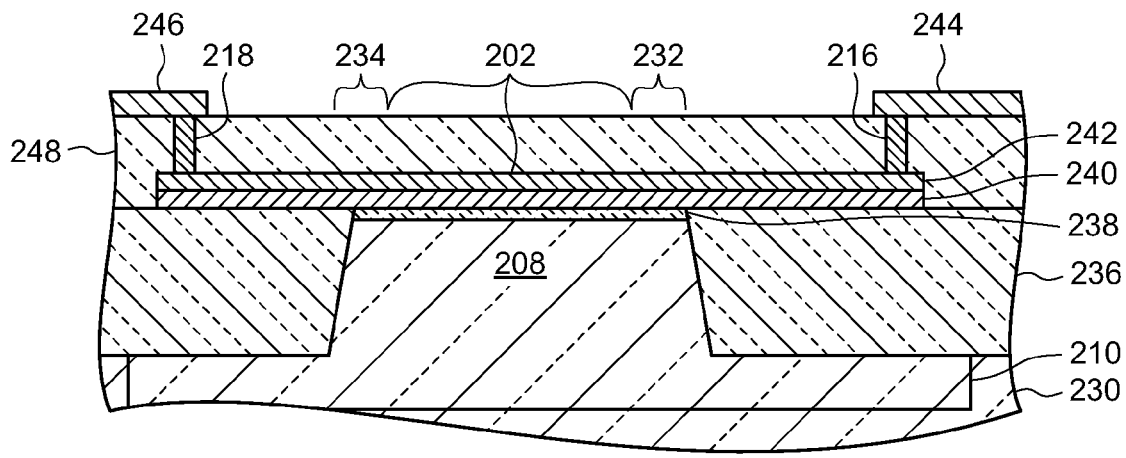
FIG. 2B is a cross section of the MOS fuse of FIG. 2A taken along section line A-A.

FIG. 2B is a cross section of the MOS fuse of FIG. 2A taken along section line A-A. The well 210 is formed in a silicon substrate 230. The well can be P-type or N-type, depending on how the MOS fuse is intended to be operated (biased). The active area 208 underlies the fuse link 202 and portions 232, 234 of the anode and cathode. Remaining portions of the anode and cathode (see FIG. 2A, ref. nums. 204, 206 overlie thick oxide 236, which in a particular embodiment is formed from an oxide layer used in a shallow trench isolation application in other portions of a CMOS IC. A gate oxide layer 238 separates the polysilicon 240 of the anode-link-cathode structure from the silicon in the active area 208. A silicide layer 242 is shown above the remaining polysilicon layer 240, and is formed by depositing a silicide-forming layer and reacting the silicide-forming material with a portion of the polysilicon layer. Alternatively, the polysilicon is entirely silicided, and there is no remaining polysilicon layer, or a silicide layer is deposited over polysilicon without consuming polysilicon.

Contacts 216, 218 electrically connect metal traces 244, 246 in a patterned metal layer (commonly referred to as the "M1 layer") in an IC. The metal traces 244, 246 are not shown in the plan view of FIG. 2A for clarity of illustration of underlying features. An oxide layer 248 is deposited on the substrate and processed to provide holes for the contacts and a surface for the metal traces, as is known in the art. Similar techniques are used to connect FETs and other devices in a CMOS IC. An IC typically has additional patterned metal layers (M2, M3, etc., not shown) that are interconnected with vias, and provide electrical connections from external pads to various internal nodes of the IC.

Figure 2C:
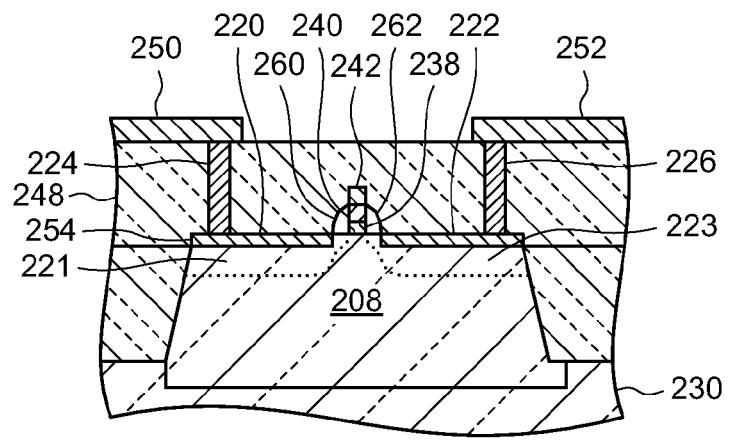
FIG. 2C is a cross section of the MOS fuse of FIG. 2A taken along section line B-B.

FIG. 2C is a cross section of the MOS fuse of FIG. 2A taken along section line B-B. Metal traces 250, 252 are connected to the S/D regions 220, 222 through contacts 224, 226 extending through oxide layer 248. The S/D regions have been silicided 254, which is shown using a different reference numeral than silicide 242 in the fuse link because the silicide is formed from silicon in the active region 208. The polysilicon 240 and gate oxide 238 between the fuse link and active region 208 are also shown. S/D diffusions 221, 223 are formed in the substrate 230. Other features, such as lightly-doped drain ("LDD") are optionally formed. Optional sidewall spacers 260, 262 are formed on the sidewalls of the fuse link polysilicon 240 prior to deposition of the silicide forming layer as part of a conventional CMOS process flow. They may be left on the sidewalls of the fuse link (poly sidewalls) as shown, or removed.

The S/D contacts 224, 226, and well contact (see FIG. 2A, ref. num. 214) in cooperation with the other contacts of the MOS fuse, allow measurement of additional MOS fuse characteristics, such as anode or cathode current leakage to the active region 208, source-drain junction currents, or drain to source channel current. The MOS fuse is characterized before programming, such as by measuring the initial values of one or more selected parameters of the MOS fuse or by determining characteristic values from wafer electrical test, and the measured MOS parameter(s) of the MOS fuse is compared against the specification to determine whether the measured MOS parameter indicates a programmed or unprogrammed state.

If the measured value(s) is essentially the same as the initial value(s), it indicates that the MOS fuse was not programmed. If the measured value(s) is significantly different from the initial value(s), it indicates that the MOS fuse was programmed. If the fuse link was incompletely programmed, or if programming of the fuse link caused physical damage that reduced the programmed resistance between the anode and cathode, the programming of that bit is invalid. In some cases, an improperly programmed bit might have an anode-cathode resistance sufficiently low that it falls below the resistance specification for a programmed bit. The additional measured values of the MOS fuse provide an indication as to the programming status (i.e., logic value) of the bit. The additional MOS fuse information can be used to detect and alarm an improperly programmed fuse, or can be used as a secondary indication of logic value (i.e., in an OR operation with fuse link resistance) to improve overall programming yield and programming reliability. For example, a MOS parameter(s) may be used to detect and indicate an improper programming condition applied by en end user, or to help identify optimized programming parameters.

Figure 3:
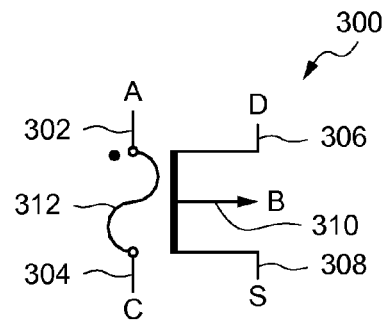
FIG. 3 is a symbol of a MOS fuse according to an embodiment.

FIG. 3 is a symbol 300 of a MOS fuse according to an embodiment. The MOS fuse has five terminals: an anode 302, a cathode 304, a drain 306, a source 308 and a well tap 310. In some embodiments, the S/D regions (see FIG. 2A, ref. nums. 220, 222) are substantially the same, and whether one of the S/D regions operates as a source or as a drain depends upon bias conditions, as is known in the art of FETs. The fuse link 312 provides a low resistance (typically not more than about 200 Ohms) path between the anode 302 and cathode 304. After programming, it is desirable that the resistance between the anode and cathode is much greater, in some cases at least 10,000 Ohms. Bits (fuse links) with lower after-programming resistance are often referred to as "tail bits," and are often not used, their data being programmed into redundant bits. It is generally desirable to reduce the number of tail bits in a programmed fuse array. Gate oxide thickness is preferably thick enough so that proper programming conditions (i.e., controlled fuse link blowing) does not substantially increase leakage. For purposes of convenient discussion, the S, D, and B terminals of the MOS fuse 300 will be referred to as "MOS terminals" and the A and C terminals will be referred to as "fuse terminals".

Figure 4:
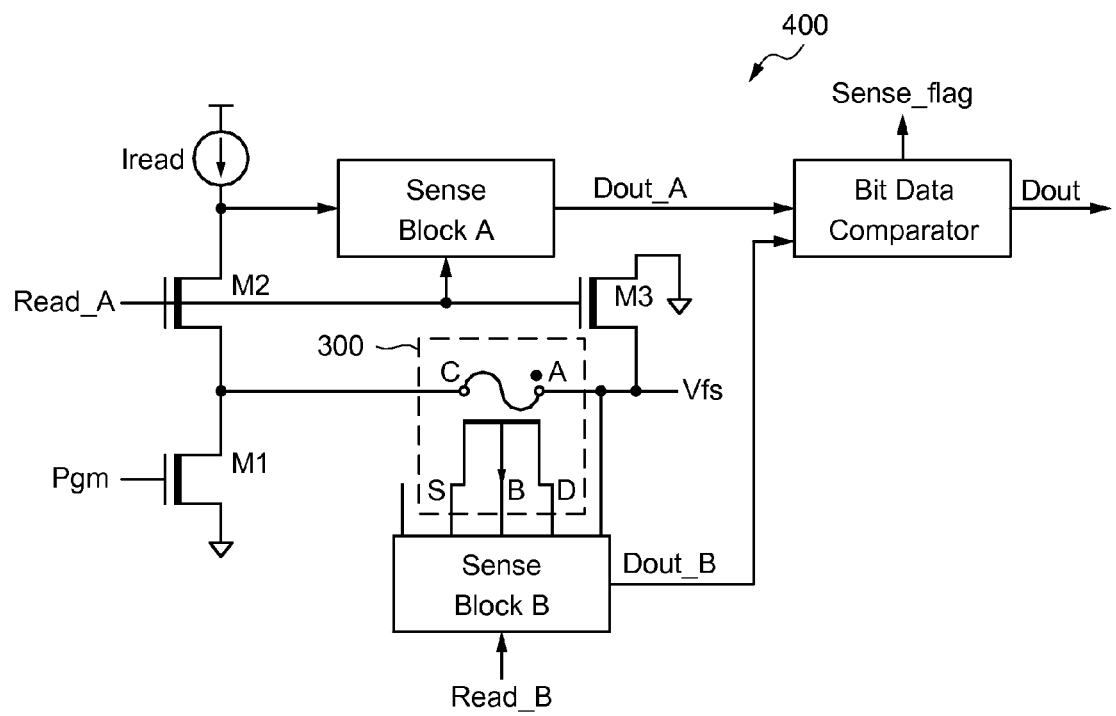
FIG. 4 is a diagram of a sensing circuit for sensing the logic state of a MOS fuse according to an embodiment.

FIG. 4 is a diagram of a sensing circuit 400 for sensing the logic state of a MOS fuse 300 according to an embodiment. During programming, Read_A and Read_B are disabled. A high voltage (typically about 3 to 4 Volts) is applied to Vfs and M1 is turned on for a selected period commonly called a programming pulse Pgm, which in a particular embodiment is about 100 to 1000 micro seconds. The Pgm pulse allows programming current to flow from Vfs to the anode, through the fuse link, to the cathode, and through M1 to ground. Sense Block B is disabled during programming, and the MOS terminals S, B, D of the MOS fuse 300 are floating.

For a READ operation, either a one-step or two-step READ is performed. If the MOS fuse 300 has been verified to have suitably high anode-cathode resistance, the Sense Block A is used to latch Dout_A by measuring the poly fuse link resistance, as in a conventional E-fuse. Pgm is OFF and Vfs is switched to ground or left floating. A Read_A signal turns on M2, which allows sensing current Iread to flow through M2, through the cathode-anode of the MOS fuse 300, and through M3 to ground. If the fuse resistance is high (i.e., the fuse link has been successfully programmed), the programmed bit causes the Sense Block A input (from Iread) to be higher than if the bit was unprogrammed (i.e., if the fuse resistance was in a low, unprogrammed value (also referred to as pristine or as-fabricated fuse resistance). The Sense Block A detects whether the input value indicates high or low fuse resistance, and produces the corresponding digital logic output value Dout_A.

The MOS fuse programming state (stored digital logic value) can also be read (sensed) using the MOS terminals S, B, D along with corresponding bias condition for C and A. Read_A is disabled, and Vfs is floated, and Read_B is asserted to activate Sense Block B. Sense Block B measures one or several MOS fuse parameters, such as fuse element-to-active silicon leakage current, source-to-well leakage, drain-to-well leakage current, source-to-drain leakage current (with C and A grounded), drain-to source channel on-current (with C and A biased), and compares the measured value(s) with stored initial values (e.g., measured values of the unprogrammed (pristine) MOS fuse or characteristic or expected pristine values). If the READ measured value(s) is within the expected range for the unprogrammed MOS fuse, a first logical data value (e.g., a data "0") is generated and latched at Dout_B. If the READ measured value indicates that the MOS fuse has been programmed (i.e., a sufficient change in one or more MOS fuse parameters measured at the one or more MOS terminals S, B, D has occurred), a second logical data value (e.g., a data "1") is generated and latched at Dout_B.

The first or second READ techniques can be used alone in a READ operation, or both can be used in a dual-READ operation. In other words, the first READ technique is used to sense the fuse resistance, and a second READ technique is used to sense the programming state (stored digital logic value) of the MOS fuse using the MOS terminals S, B, D. The Dout_A value is compared to the Dout_B value at a Bit Data Comparator. In a particular embodiment, if either Dout_A or Dout_B indicates that the MOS fuse 300 has been programmed, the Bit Data Comparator generates a digital logic value (e.g., digital "1") corresponding to a programmed bit. In other words, the single MOS fuse 300 has redundant storage.

In a further embodiment, the Bit Data Comparator generates a Sense_flag output if Dout_A is a different digital data value than Dout_B. For example, if a MOS fuse programming step fails to provide a sufficiently high fuse resistance to set Dout_A to a programmed value, but sensing the MOS terminals indicates that a programming step had been applied to the MOS fuse, then the Sense_flag would be asserted to indicate a discrepant programming step; however, the logic state of the MOS fuse would still be correctly indicated by Dout_B and the OR operation provided by the Bit Data Comparator. This reduces the number of fail bits, and also provides an indication of the efficiency of the programming operation. In other embodiments, other logic gates or functions, such as an AND operation, may be used in the Bit Data Comparator.

Figure 5:
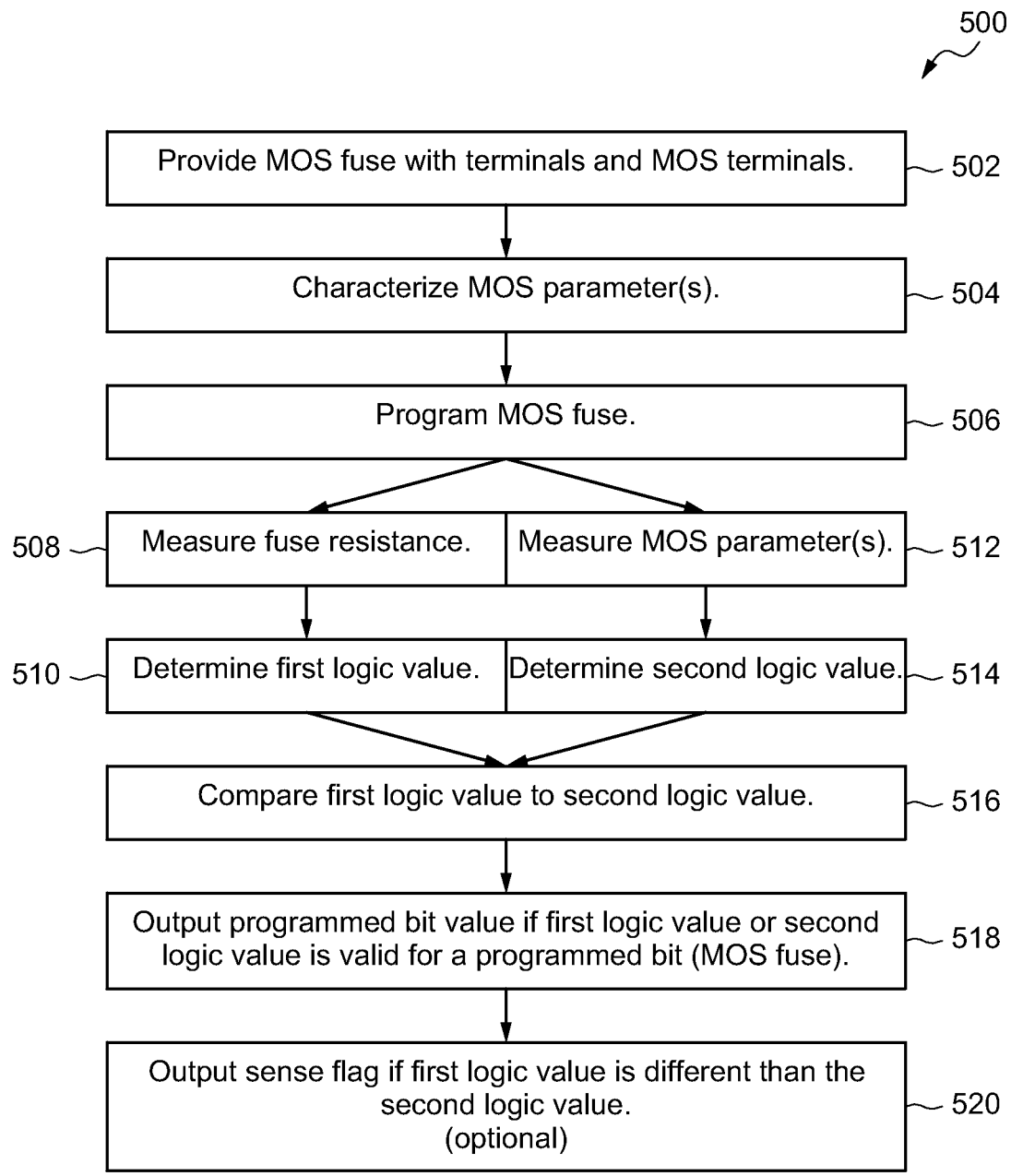
FIG. 5 is a flow chart of a method of operating a MOS fuse according to an embodiment.

FIG. 5 is a flow chart of a method 500 of operating a MOS fuse according to an embodiment. A MOS fuse having fuse terminals and MOS terminals is provided (step 502). At least one MOS parameter is characterized before programming (step 504). In a particular embodiment, one or more MOS parameters of the MOS fuse are measured, and the initial MOS parameter values are stored for future comparison. Examples of MOS parameters include fuse element-to-active silicon leakage current, source-to-well leakage, drain-to-well leakage current, source-to-drain leakage current, drain-to-source, and channel ON current. The MOS fuse is programmed (step 506) by applying a programming signal through the fuse terminals. Generally, the programming signal is a selected amount of current applied through the fuse element for a selected period of time sufficient to significantly increase the resistance between the fuse terminals after programming, typically by fusing the fuse link. In a particular embodiment, the programming signal is a three to four volt signal applied for about 0.1 msec to about 10 ms to a fuse element having an initial (as-fabricated) resistance of about 200 Ohms. After programming, the fuse element is desired to have a programmed resistance of at least 10,000 Ohms.

After programming, the resistance between the fuse terminals is measured (step 508) and compared against a fuse resistance reference value to determine a first digital logic value (step 510) of the MOS fuse, i.e., to determine whether the fuse resistance indicates that the MOS fuse has been programmed. After programming, one or more MOS parameters of the MOS fuse are measured to provide at least one measured MOS parameter value (step 512), and the measured value(s) is compared against the MOS parameter reference value(s) to determine a second digital logic value (step 514) of the MOS fuse. It is generally expected that the first and second digital logic values are the same value (i.e., both are 0 or both are 1); however, in some cases the first digital logic value might be different than the second digital logic value. Alternatively, the MOS parameter(s) is read before the fuse resistance.

The first digital logic value is compared to the second digital logic value (step 516). If either the first digital logic value or the second digital logic value is consistent with a programmed value (i.e., if either the fuse resistance or MOS parameter(s) indicate that the MOS fuse was subjected to a programming pulse), a programmed bit value (see FIG. 4, Dout) is output (step 518). In a further embodiment, if the first digital logic value is different than the second digital logic value, a sense flag is output (step 520), indicating that the fuse element might have been improperly programmed. In a particular embodiment, the sense flag is enabled if the first digital logic value is an invalid programmed value and the second digital logic value is a valid programmed value.

Figure 6:
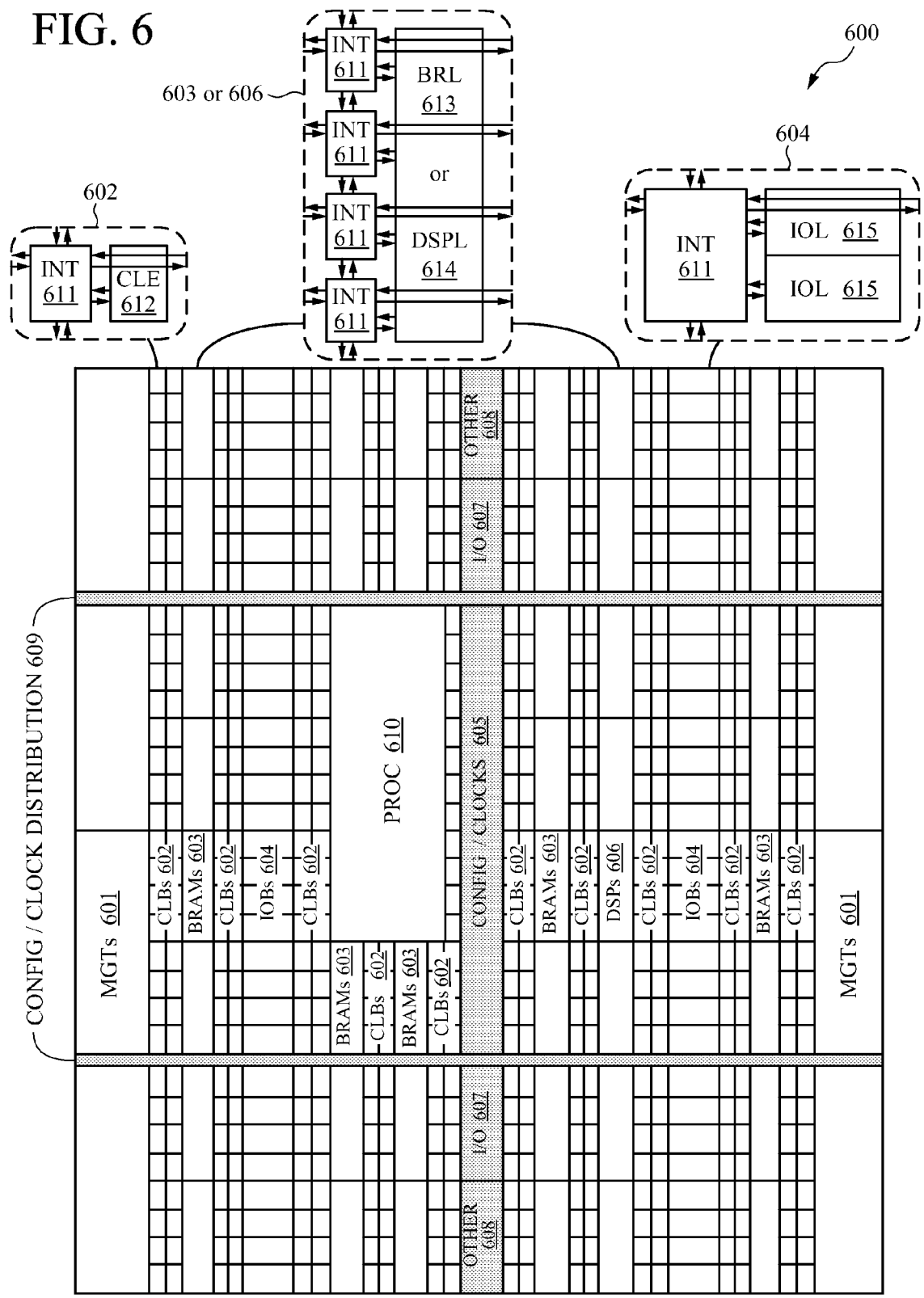
FIG. 6 is a plan view of an FPGA according to an embodiment.

FIG. 6 is a plan view of a field programmable gate array (FPGA) according to an embodiment. The FPGA includes CMOS portions in several of the functional blocks, such as in RAM and logic, and is fabricated using a CMOS fabrication process. MOS fuses programmed according to one or more embodiments of the invention are incorporated in any of several functional blocks of the IC, such as a memory block, logic block, I/O block, clock circuit, transceiver, or other functional block; within many functional blocks; or within a physical section or segment of the FPGA 600. MOS fuses programmed according to one or more embodiments of the invention are particularly desirable for non-reconfigurable, NV memory applications, such as serial numbers, storing security bits that disable selected internal functions of the FPGA, bit-stream encryption key storage, or to provide a user general-purpose one-time programmable NV user-defined bit storage.

The FPGA architecture includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615. In the pictured embodiment, a columnar area near the center of the die (shown shaded in FIG. 6) is used for configuration, clock, and other control logic.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative layouts and cross-sections of MOS fuses could be alternatively used, and alternative sensing circuitry can be used. Therefore, the spirit and scope of the appended claims should not be limited to the foregoing description.

The invention claimed is:

1. A metal-oxide-semiconductor ("MOS") fuse comprising:
   a semiconductor substrate;
   a well in the semiconductor substrate;
   a well tap in the well, wherein the well tap includes a first contact;
   an active region in the well;
   a fuse element having an anode, a cathode, and a fuse link extending between the anode and the cathode, at least the fuse link being formed over a portion of the active region and being separated from the active region by an oxide layer;
   a drain region that includes a second contact;
   a source region that includes a third contact, the fuse link separating the drain region from the source region;
   a first sense circuit coupled to the anode and cathode, the first sense circuit configured to latch a first logic value representative of a resistance level between the anode and the cathode in response to a read signal;
   a second sense circuit, coupled to the first contact, the second contact, and the third contact, wherein the second sense circuit is configured to latch a second logic value in response to the read signal, the second logic value being representative of one of a fuse element-to-active silicon leakage current, a source-to-well leakage current, a drain-to-well leakage current, or a source-to-drain leakage current; and
   a comparator circuit coupled to the first and second sense circuits and configured to output a sense-flag signal indicative of relative states of the first and second logic values.

2. The MOS fuse of claim 1 wherein the oxide layer is a gate oxide layer.

3. The MOS fuse of claim 1 wherein the oxide layer is not greater than 10 nm thick.

4. The MOS fuse of claim 1 wherein the semiconductor substrate is a silicon substrate and the fuse element comprises silicon.

5. The MOS fuse of claim 4 wherein the fuse element includes first silicide and the drain region and the source region include second silicide.

6. The MOS fuse of claim 1 wherein the fuse element comprises silicide.

7. The MOS fuse of claim 1 further comprising:
a first sidewall spacer on a first side of the fuse link between the fuse link and the drain region; and
a second sidewall spacer on a second side of the fuse link between the fuse link and the source region.

8. The MOS fuse of claim 1 wherein the sense block is further configured to compare a measured value of the fuse element-to-active silicon leakage current, the source-to-well leakage current, the drain-to-well leakage current, or the source-to-drain leakage current with a stored value of the fuse element-to-active silicon leakage current, the source-to-well leakage current, the drain-to-well leakage current, or the source-to-drain leakage current to determine if the MOS fuse has been programmed.

9. The MOS fuse of claim 1, the comparator circuit configured to output a data signal having a state that is a logical OR of the first logic value and the second logic value.

10. A metal-oxide-semiconductor ("MOS") fuse comprising:
a semiconductor substrate;
a well in the semiconductor substrate;
a well tap in the well, wherein the well tap includes a first contact;
an active region in the well;
a fuse element having an anode, a cathode, and a fuse link extending between the anode and the cathode, at least the fuse link being formed over a portion of the active region and being separated from the active region by an oxide layer;
a drain region that includes a second contact;
a source region that includes a third contact, the fuse link separating the drain region from the source region;
a first sense circuit coupled to the anode and to the cathode and configured to measure a fuse resistance between the anode and the cathode and output a first logic value representative of the measured fuse resistance; and
a second sense circuit coupled to the first contact, the second contact, and the third contact, wherein the second sense circuit is configured to measure a fuse element-to-active silicon leakage current, a source-to-well leakage current, a drain-to-well leakage current, a source-to-drain leakage current, or a drain-to-source channel ON current and output a second logic value representative of the measured current.

11. The MOS fuse of claim 10, further comprising a bit data comparator comparing the first logic value and the second logic value, and configured to output a sense flag if the first logic value does not match the second logic value.

12. The MOS fuse of claim 10 wherein the oxide layer is not greater than 10 nm thick.

13. The MOS fuse of claim 12 wherein the fuse element is a silicide fuse element.

14. The fuse of claim 10 wherein the second sense circuit is further configured to compare a measured value of the fuse element-to-active silicon leakage current, the source-to-well leakage current, the drain-to-well leakage current, the source-to-drain leakage current, or the drain-to-source channel ON current with a stored value of the fuse element-to-active silicon leakage current, the source-to-well leakage current, the drain-to-well leakage current, the source-to-drain leakage current, or the drain-to-source channel ON current.

* * * * *